United States Patent
Fukshima et al.

(10) Patent No.: US 7,709,282 B2
(45) Date of Patent: May 4, 2010

(54) METHOD FOR PRODUCING A LIGHT EMITTING DEVICE

(75) Inventors: Hiroshi Fukshima, Kadoma (JP); Masao Kubo, Nara (JP); Akira Inoue, Neyagawa (JP); Kenichiro Tanaka, Neyagawa (JP); Mikio Masui, Kashiba (JP); Shinji Matsui, Himeji (JP)

(73) Assignee: Panasonic Electric Works Co., Ltd., Osaka (JP)

( * ) Notice: Subject to any disclaimer, the term of this patent is extended or adjusted under 35 U.S.C. 154(b) by 23 days.

(21) Appl. No.: 10/575,489

(22) PCT Filed: Nov. 11, 2004

(86) PCT No.: PCT/JP2004/017121

§ 371 (c)(1),
(2), (4) Date: Apr. 12, 2006

(87) PCT Pub. No.: WO2005/048361

PCT Pub. Date: May 26, 2005

(65) Prior Publication Data

US 2007/0065960 A1    Mar. 22, 2007

(30) Foreign Application Priority Data

Nov. 12, 2003    (JP)    ............................. 2003-383064

(51) Int. Cl.
*H01L 21/56*    (2006.01)
(52) U.S. Cl. .............................. 438/26; 438/22; 438/47; 257/E21.499; 257/E21.502; 257/E21.503
(58) Field of Classification Search .................. 216/24, 216/41; 257/25, 81, 91, 95, 98–100, 103, 257/E21.499, E21.502, E21.503; 438/22, 438/46, 47, 918, 9, 42, 26
See application file for complete search history.

(56) References Cited

U.S. PATENT DOCUMENTS 5,779,924 A    7/1998    Krames et al.

(Continued)

FOREIGN PATENT DOCUMENTS

EP    1271665    1/2003

(Continued)

OTHER PUBLICATIONS

Hirai, Study of the resist deformation in nanoimprint lithography, J. Vac. Sci. Technol. B, 19, pp. 2811-2815, 2001.*

(Continued)

*Primary Examiner*—Kiesha R Bryant
*Assistant Examiner*—Minchul Yang
(74) *Attorney, Agent, or Firm*—Greenblum & Bernstein, P.L.C.

(57)    ABSTRACT

A production method for producing a light-emitting device 1 in which a light-emitting layer at least comprised of a n-type substrate bearing layer 3 and a p-type substrate bearing layer 4 is layered on a transparent crystal substrate 2 is provided with a step of forming a transfer layer 5 on at least a part of the transparent crystal substrate 2 or the light-emitting layer 3, 4, which transfer layer 5 is softened or set upon supplying an energy thereto; a step of pressing a mold 6 formed with a minute unevenness structure 61 against the transfer layer 5 to transfer the minute unevenness structure 61 to an outer surface of the transfer layer 5, and a step of forming a minute unevenness structure 21, 34 for preventing multiple reflection based on the minute unevenness structure 51 transferred to the transfer layer 5.

12 Claims, 15 Drawing Sheets

U.S. PATENT DOCUMENTS

| | | |
|---|---|---|
| 6,410,348 B1 | 6/2002 | Chen et al. |
| 6,495,862 B1 * | 12/2002 | Okazaki et al. ............. 257/103 |
| 6,614,172 B2 * | 9/2003 | Chiu et al. ................. 313/501 |
| 6,987,613 B2 * | 1/2006 | Pocius et al. ................ 359/565 |
| 7,154,125 B2 | 12/2006 | Koide et al. |
| 7,179,672 B2 * | 2/2007 | Asakawa et al. .............. 438/29 |
| 2002/0132083 A1 * | 9/2002 | Weller et al. .............. 428/65.3 |
| 2002/0195609 A1 | 12/2002 | Yoshitake et al. |
| 2003/0075723 A1 | 4/2003 | Heremans et al. |
| 2003/0173568 A1 | 9/2003 | Asakawa et al. |
| 2004/0080938 A1 * | 4/2004 | Holman et al. .............. 362/231 |
| 2005/0064322 A1 * | 3/2005 | Babich et al. ............ 430/270.1 |
| 2005/0082545 A1 * | 4/2005 | Wierer et al. ................ 257/79 |

FOREIGN PATENT DOCUMENTS

| | | |
|---|---|---|
| EP | 1324399 | 7/2003 |
| JP | 63-283174 | 11/1988 |
| JP | 6-291368 | 10/1994 |
| JP | 9-166874 | 6/1997 |
| JP | 11-168236 | 6/1999 |
| JP | 2000-232095 | 8/2000 |
| JP | 2002-368289 | 12/2002 |
| JP | 2003-100609 | 4/2003 |
| JP | 2003-218383 | 7/2003 |
| JP | 2003-318443 | 11/2003 |
| JP | 2003-347586 | 12/2003 |

OTHER PUBLICATIONS

Chou, Nanoimprint lithography, J. Vac. Sci. Technol. B, 14, pp. 4129-4133, 1996.*
English Language Abstract of JP 6-291368.
English Language Abstract of JP 2002-368289.
English Language Abstract of JP 2000-232095.
English Language Abstract of JP 2003-100609.
Office Action for Chinese Application No. 200480031178.7.
English Language Translation of Office Action for Chinese Application No. 200480031178.7.
English language Abstract of JP 2003-218383.
English language Abstract of JP 2003-318443.
English language Abstract of JP11-168236.
English language Abstract of JP2003-347586.
English language Abstract of JP9-166874.
English language Abstract of JP 63-283174.

* cited by examiner

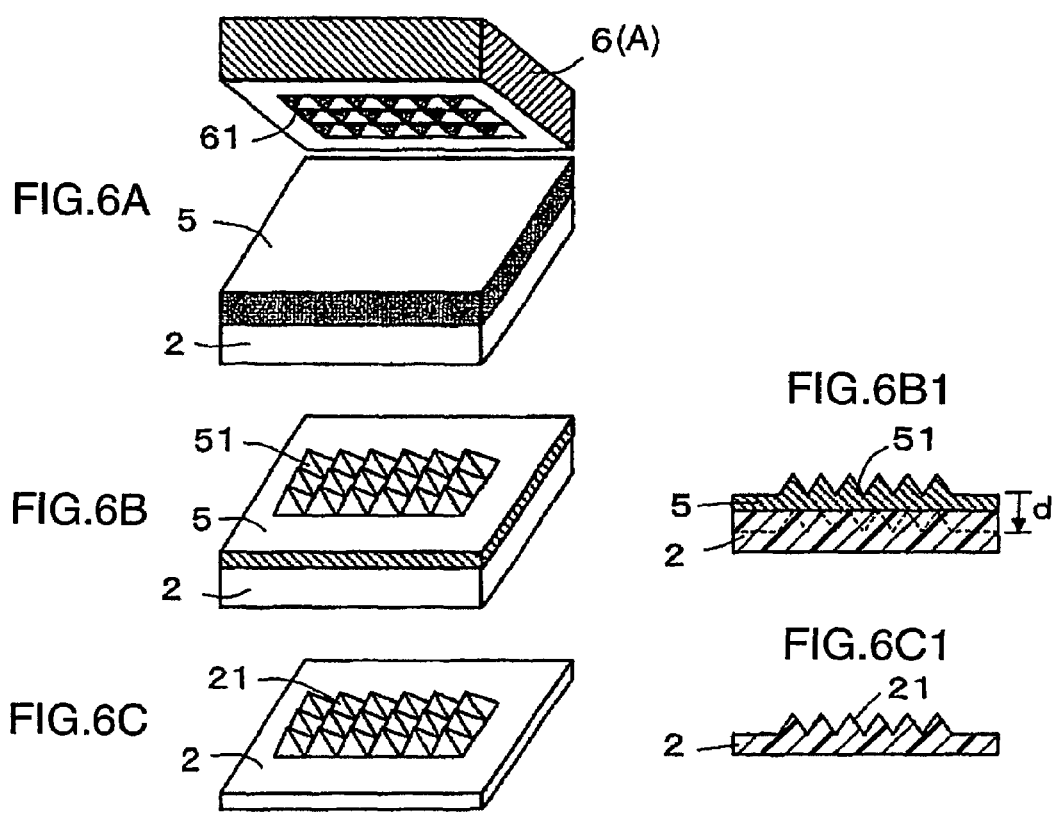

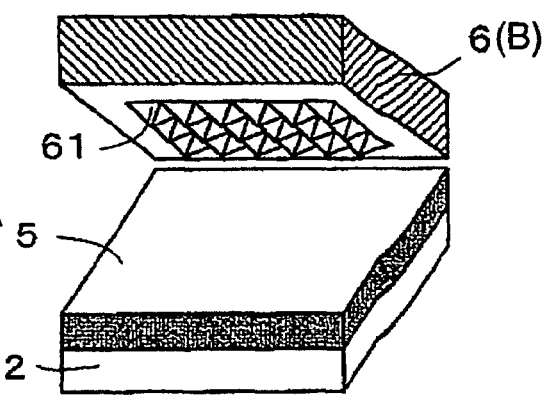
FIG.7A
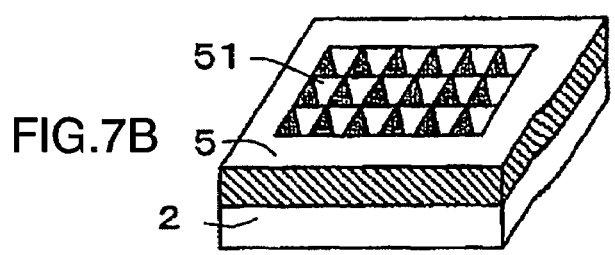
FIG.7B
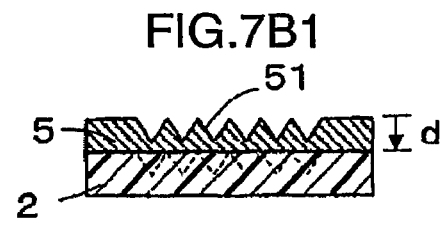
FIG.7B1
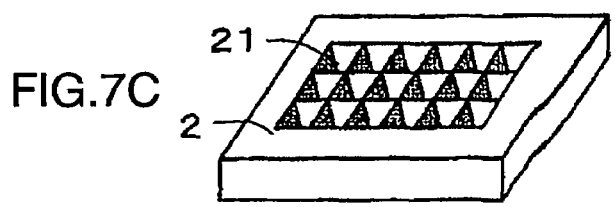
FIG.7C
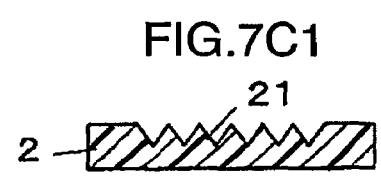
FIG.7C1

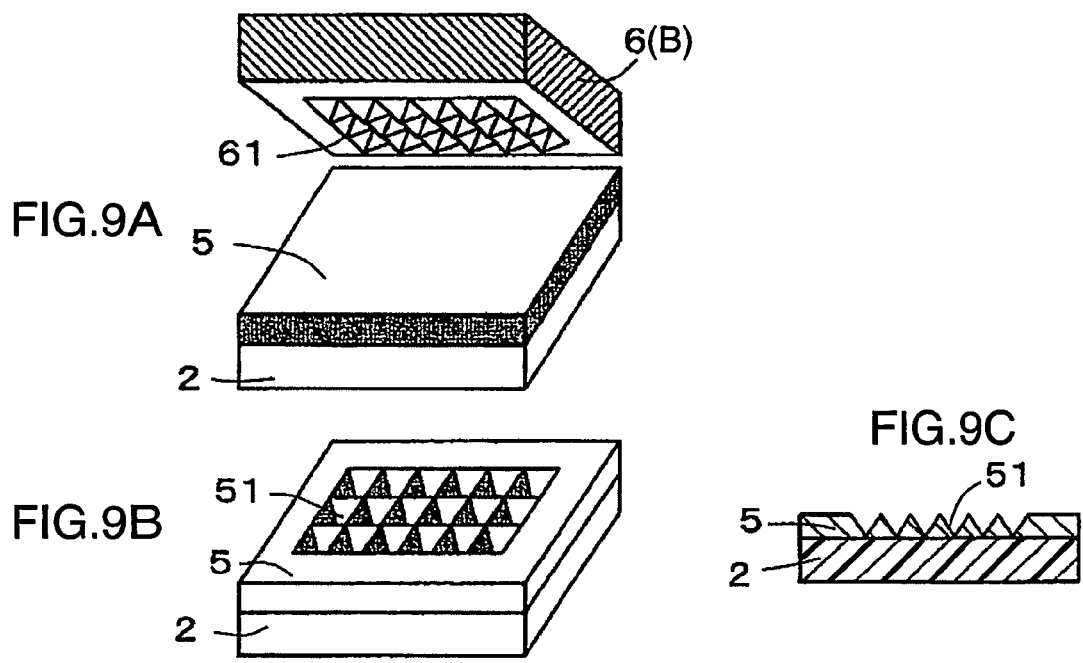

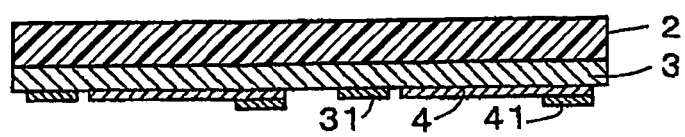
FIG.11A
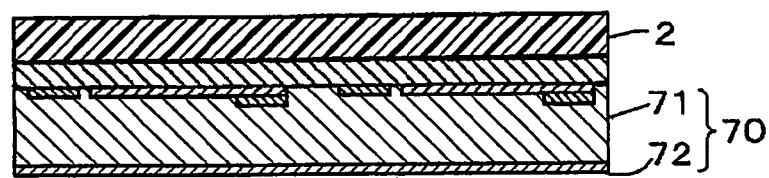
FIG.11B
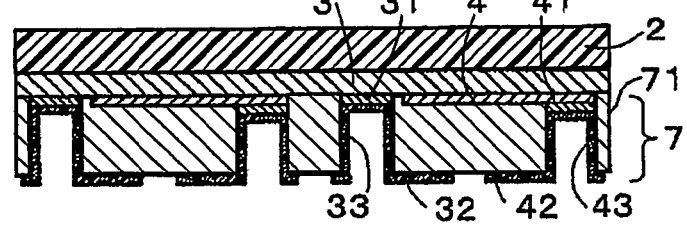
FIG.11C
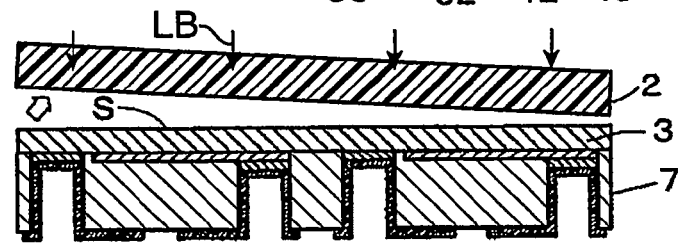
FIG.11D
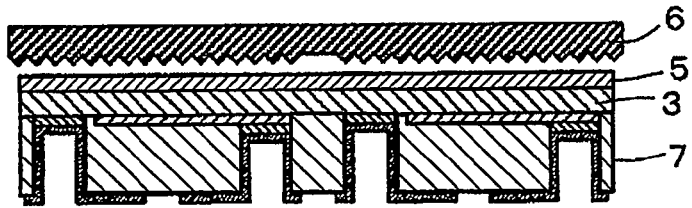
FIG.11E
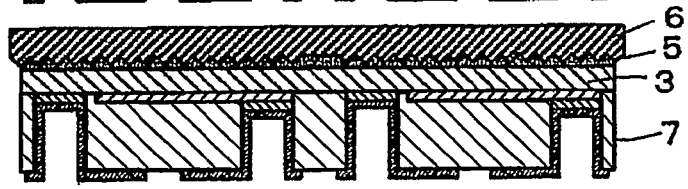
FIG.11F
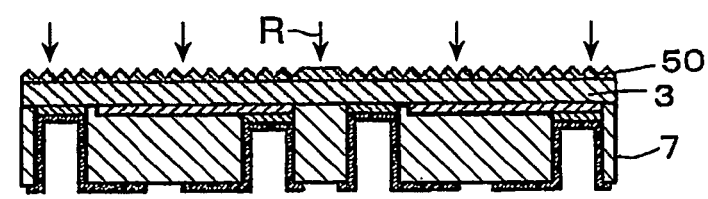
FIG.11G
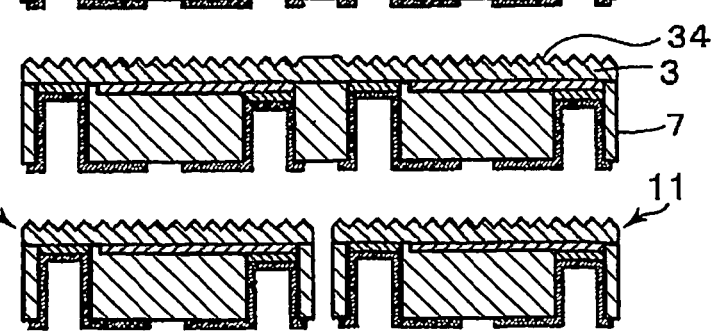
FIG.11H
FIG.11I

METHOD FOR PRODUCING A LIGHT EMITTING DEVICE

BACKGROUND OF THE INVENTION

1. Technical Field

The present invention relates to a method for producing a light-emitting device having an improved light extraction efficiency.

2. Background Art

In general, light emitted from an active layer of a light-emitting device cannot be efficiently extracted since being reflected at an interface due to a difference in the refractive indices of the light-emitting layer, a transparent crystal substrate and the outside air.

In view of the above, there has been developed a light-emitting device designed to improve a light extraction efficiency by suppressing the absorption caused by the multiple reflection by forming the outer surface of the light-emitting device to have an unevenness structure. As a method for forming an unevenness structure, there have been adopted a method for forming an uppermost layer into an unevenness surface during the growth and a method for chemically or physically forming an uppermost layer into an unevenness surface after the growth (see Japanese Unexamined Patent Publication No. H06-291368).

There has been also proposed a method for forming an unevenness in a transparent resin layer coating a light-emitting surface of a light-emitting device. The light-emitting device is joined with a transparent substrate via the coating transparent resin layer, and the resin layer is irradiated with a laser beam through the transparent substrate, whereby the resin layer is formed with an unevenness structure by the laser ablation (Japanese Unexamined Patent Publication No. 2002-368289).

There is also known a method for pressing a mold against a resist formed on a surface of a substrate to transfer an unevenness structure to the resist and transferring the unevenness structure to the substrate by dry etching of a low selection ratio using this resist as a mask (Japanese Unexamined Patent Publication No. 2000-232095).

There is further known a method for applying a SOG film to a surface of a substrate, pressing a mold against the SOG film to transfer an unevenness structure, and transferring the unevenness structure to the substrate by RIE (reactive ion etching) using this SOG film as a resist mask (Japanese Unexamined Patent Publication No. 2003-100609).

However, according to the method for forming the outer surface into the unevenness structure during the growth disclosed in Japanese Unexamined Patent Publication No. H06-291368, an improvement in the light extraction efficient is as low as about 10% since a degree of surface roughness is low. On the other hand, according to the method for chemically or physically forming the outer surface into the unevenness structure after the growth disclosed in the same publication, the shape reproducibility of the unevenness structure is poor since the outer surface is merely made rough by etching or grinding. Further, since the unevenness structure is formed by the laser ablation according to the method disclosed in Japanese Unexamined Patent Publication No. 2003-368289, there is a problem of a poor shape reproducibility of the minute unevenness structure. As a processing method having a good shape reproducibility, an unevenness structure may be formed by dry etching after a pattern is formed by optical lithography. However, it is still difficult to form an unevenness structure having a pyramidal shape, a semispherical shape or any arbitrary shape or minute unevenness structure having a size equal to or below a resolution restricted by wavelength.

In Japanese Unexamined Patent Publication No. 2000-232095, an ion milling method according to which the resist and the semiconductor layer are etched substantially at the same speed is adopted as the dry etching of a low selection ratio. Since a surface to be etched has a strong angle dependency according to the ion milling method, this method can be applied to form a rectangular unevenness structure or unevenness structure having a pitch in the range of from several nm to several tens of nm where the angle does not count, but it is difficult to form a minute unevenness structure having a pitch in the range of from several hundreds of nm to several μm, where the angle is not negligible such as those having a pyramidal shape.

Further, a polymer resist made of, e.g., polymethyl-methacrylate (PMMA) is used as the resist. Since such a resist has a low resistance to dry etching if a dry etching method with a chlorine gas is adopted, it is difficult to process the resist to have minute pyramidal or semispherical unevenness structures or process the resist to have about the same selection ratio.

In Japanese Unexamined Patent Publication No. 2002-100609, the depth range of the unevenness structure of about 100 nm is disclosed in an embodiment. In order to transfer an unevenness structure having pitches or depth in the range of about several μm, a pressure which is at least tenfold of the pressure disclosed in the embodiment is actually necessary, wherefore it is difficult to transfer an unevenness structure of several hundreds of nm to several μm to a light-emitting layer or a transparent crystal substrate (sapphire substrate).

SUMMARY OF THE INVENTION

It is an object of the present invention to provide a method for producing a light-emitting device which is free from the problems residing in the prior art.

It is another object of the present invention to provide a method for producing a light-emitting device which has an improved light extraction efficiency by forming a minute unevenness structure for preventing multiple reflection in a transparent crystal substrate or a light-emitting layer having at least a n-type semiconductor layer and a p-type semiconductor layer.

According to an aspect of the present invention, a production method for producing a light-emitting device in which a light-emitting layer including a n-type semiconductor layer and a p-type semiconductor layer is layered on a transparent crystal substrate. The method comprises the steps of forming a transfer layer on at least a part of the transparent crystal substrate or the light-emitting layer, which transfer layer is softened or set upon supplying an energy thereto; pressing a mold formed with a minute unevenness structure against the transfer layer to transfer the minute unevenness structure to an outer surface of the transfer layer; and forming a minute unevenness structure for preventing multiple reflection based on the minute unevenness structure transferred to the transfer layer.

These and other objects, features, aspects, and advantages of the present invention will become more apparent from the following detailed description of the preferred embodiments/examples with reference to the accompanying drawings.

BRIEF DESCRIPTION OF THE DRAWINGS

FIGS. 6A to 6C are perspective views showing a production process of the light-emitting device using a mold according to one embodiment of the invention, wherein FIG. 6B1 is a section of FIG. 6B and FIG. 6C1 is a section of FIG. 6C;

FIGS. 7A to 7C are perspective views showing a production process of the light-emitting device using a mold according to another embodiment of the invention, wherein FIG. 7B1 is a section of FIG. 7B and FIG. 7C1 is a section of FIG. 7C;

FIGS. 9A and 9B are perspective views showing a production process of the light-emitting device according to another embodiment of the invention, and FIG. 9C is a section of FIG. 9B;

FIGS. 11A to 11I are diagrams showing operation steps of the light-emitting device production method according to the second embodiment of the invention;

DETAILED DESCRIPTION OF THE PREFERRED EMBODIMENTS OF THE INVENTION

Hereinafter, best modes for carrying out the present invention are described in detail with reference to the accompanying drawings.

Figure 1:
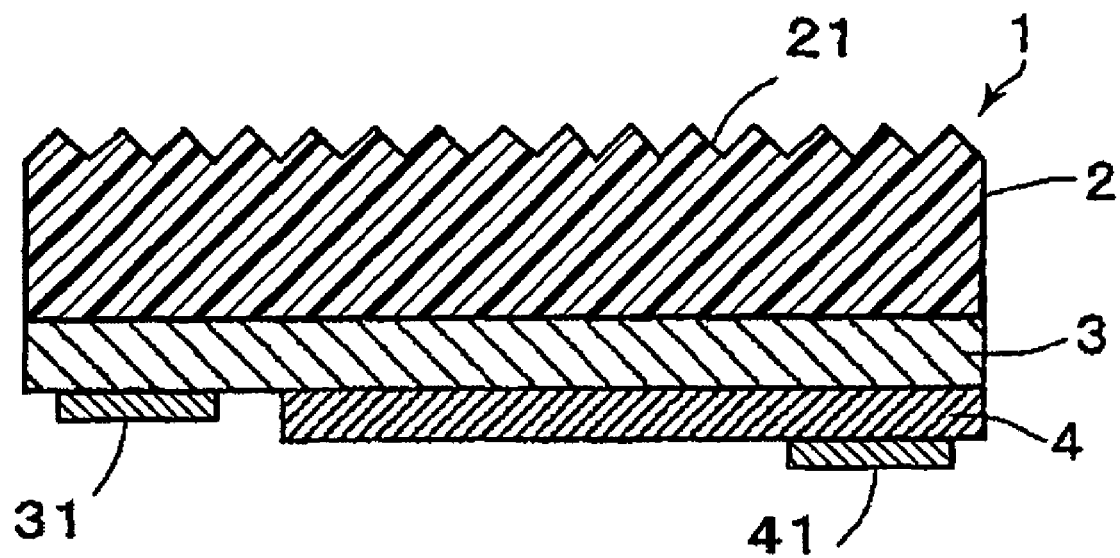
FIG. 1 is a section of a light-emitting device produced by a production method according to a first embodiment of the invention.
Figure 2:
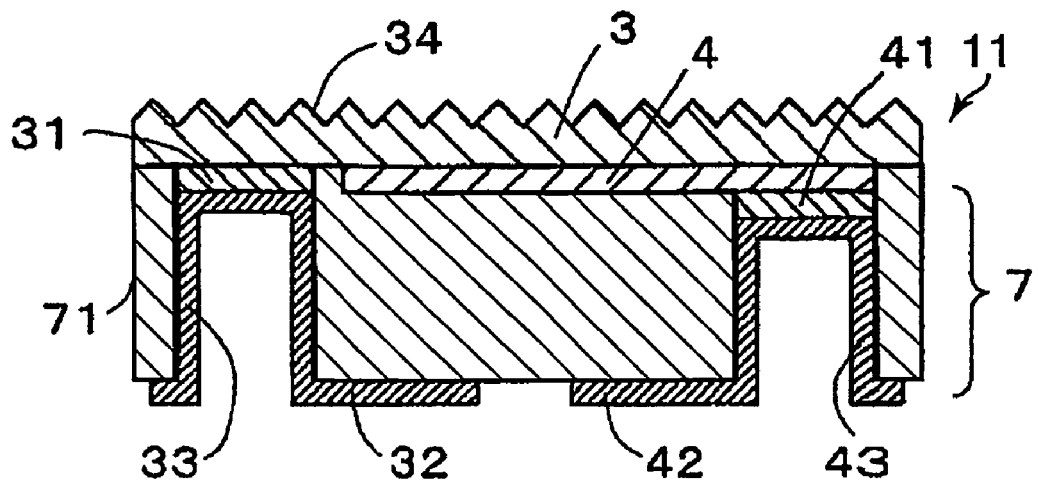
FIG. 2 is a section of a light-emitting device produced by a production method according to a second embodiment of the invention.
Figure 3:
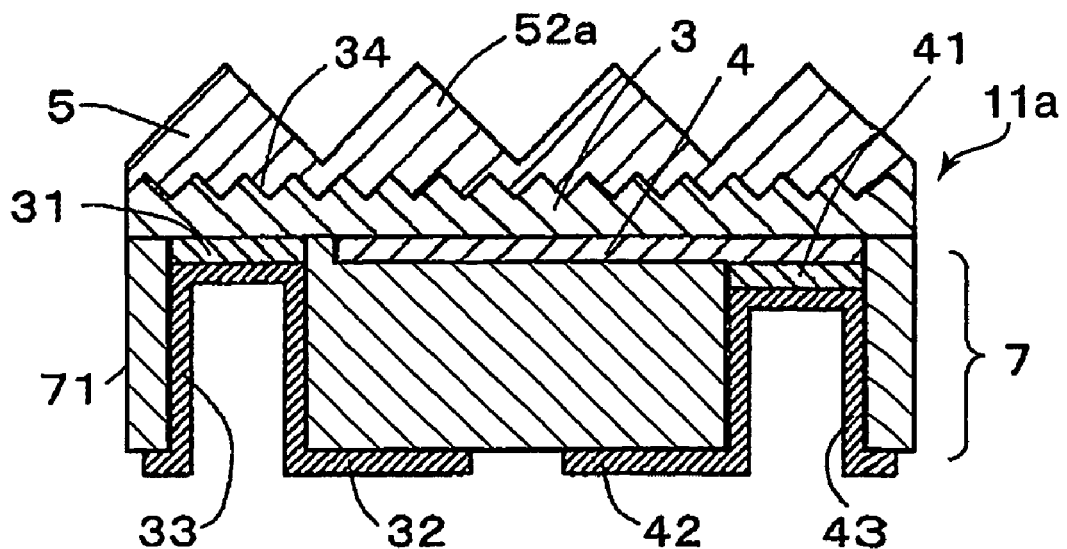
FIG. 3 is a section of a light-emitting device as a modification of the light-emitting device produced by the production method according to the second embodiment of the invention.

FIG. 1 is a section of a light-emitting device 1 produced by a production method according to a first embodiment; FIG. 2 is a section of a light-emitting device 11 produced by a production method according to a second embodiment, and FIG. 3 is a section of a light-emitting device 11a as a modification of the light-emitting device 11 produced by the production method according to the second embodiment.

The light-emitting device 1 shown in FIG. 1 is constructed such that a light-emitting layer having a n-type GaN semiconductor layer 3 and a p-type GaN semiconductor layer 4 is adhered to one surface (lower surface in FIG. 1) of a transparent crystal substrate made of, e.g., sapphire ($Al_2O_3$). Electrodes 31, 41 are formed on the respective n-type GaN semiconductor layer 3 and p-type GaN semiconductor layer 4, and a minute unevenness structure 21 for preventing multiple reflection is formed on the other surface (upper surface in FIG. 1) of the transparent crystal substrate 2.

Out of rays of light emitted from a light-emitting layer at an interface portion of the semiconductor layers 3, 4 by applying a voltage to the semiconductor layers 3, 4 via the electrodes 31, 41, those propagating, for example, upward are used for illumination, display, or other application. A method for producing this light-emitting device 1 is described later.

Since the minute unevenness structure 21 for preventing the multiple reflection are formed in the light-emitting device 1, the light emitted from the light-emitting layer comprised of the semiconductor layers 3, 4 adhered to the transparent crystal substrate 2 can be efficiently extracted to the outside of the light-emitting device 1 through the light-emitting layer comprised of the semiconductor layers 3, 4 and the transparent crystal substrate 2.

Refractive indices n of the transparent crystal substrate 2 and the light-emitting layer comprised of the semiconductor layers 3, 4 are: n=1.768 for the aforementioned transparent crystal substrate 2 ($Al_2O_3$) and n=2.5 for the semiconductor layers (GaN) 3, 4; n=3.3 to 3.8 for the semiconductor layers made of GaAS, n=3.31 for the semiconductor layers made of GaP, and n=2.7 to 2.8 for the substrate made of SiC. These refractive indices are larger than the refractive index n=1 of atmospheric air at the outside of the light-emitting device to which the light is extracted, and total reflection is likely to occur inside the light-emitting layer comprised of the semiconductor layers 3, 4 and the transparent crystal substrate 2. Thus, the light extraction efficiency to the outside decreases due to the multiple reflection caused by the repeated total reflection if the minute unevenness structure 21 for preventing the multiple reflection as above are absent.

Accordingly, the minute unevenness structure 21 is formed at an interface between the transparent crystal substrate and air to cause irregular refection or diffraction. In this way, the light extraction efficiency of the light-emitting device 1 can be improved.

As a method for forming the minute unevenness structure 21 at an inner interface of the light-emitting device 1 or at an outer surface (i.e., interface with the air) of the light-emitting device 1, particularly a surface of the light-emitting device 1 in parallel with the light-emitting layer of the light-emitting device 1, embossing or imprinting for transferring the minute unevenness structure of a mold (transfer mold) is used in the present invention. Embossing and imprinting are applications of compression molding to a minute processing area, and the minute unevenness structure formed thereby have large degrees of freedom in size and precision. Thus, embossing and imprinting can improve productivity and reduce production costs.

A nanoimprinting technology proposed by Chou and other scientist at Princeton University in 1995 as a minute processing limit of the aforementioned imprinting technology is known as a processing technology having a resolution of about 10 nm despite being inexpensive.

Such an imprinting technology is used in the method for producing the inventive light-emitting device 1 provided with the minute unevenness structure 21 for preventing the multiple reflection.

In the light-emitting device 11 shown in FIG. 2, a minute unevenness structure 34 for preventing the multiple reflection are formed in the outer surfaces of the semiconductor layers 3, 4 having appeared by removing the transparent crystal substrate 2 in the light-emitting device 1 shown in FIG. 1. In this light-emitting device 11, the light can be directly and efficiently extracted from the outer surfaces of the semiconductor layers 3, 4 to the outside without the presence of any inclusion, i.e., the transparent crystal substrate 2.

In order to take a construction like that of the light-emitting device 11, it is necessary to form a substrate bearing layer 7. The substrate bearing layer 7 includes a resin layer 71 for holding the semiconductor layers 3, 4, mounting-surface electrodes 32, 42, and electrode connecting paths 33, 43 for electrically connecting the electrodes 31, 41 on the outer surfaces of the semiconductor layers 3, 4 and the mounting-surface electrodes 32, 42 so that currents can be introduced from the mounting-surface electrodes 32, 42 to the electrodes 31, 41. A method for producing the light-emitting device 11 is described later.

The light-emitting device 11a shown in FIG. 3 is such that a minute unevenness structure 34 in the form of diffraction grating having pitches of 1000 nm to 3000 nm are formed as the minute unevenness structure for preventing the multiple reflection in the light-emitting device 11 shown in FIG. 2, and a prism-shaped unevenness structure 52a having pitches of 10 μm to 50 μm (preferably 10 μm to 20 μm) are formed on the outer surface of the minute unevenness structure 34.

In this light-emitting device 11a, a distribution of the emitted light can be gathered toward a light emitting direction (upward in FIG. 3) by the prism-shaped unevenness structure 52a formed on the minute unevenness structure 34 formed on the light emitting surface to prevent the multiple reflection, thereby enabling an improvement of a frontal luminance. Further, another nanostructure (structure having a cycle and a height of about ¼ of an object wavelength, e.g., a cycle of about 100 nm and height of 100 to 400 nm) is formed on the outer surface of the prism-shaped unevenness structure 52a of the light-emitting device 11a as described later, whereby a Fresnel loss at this surface can be reduced.

First, with respect to FIGS. 4A to 4F, a process for producing the light-emitting device 1 by the production method of the first embodiment is described.

Figure 4A:
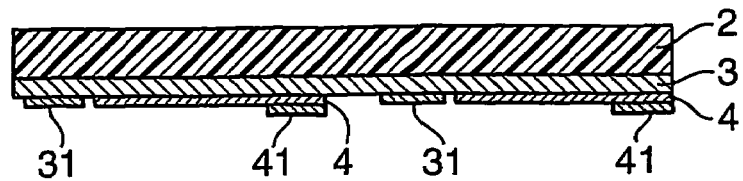
FIGS. 4A to 4F are diagrams showing operation steps of the production method according to the first embodiment for forming a minute unevenness structure in a transparent crystal substrate.

As shown in FIG. 4A, one or more light-emitting devices are formed by adhering the light-emitting layer comprised of the semiconductor layers 3, 4 to one surface (lower surface in FIG. 4A) of one transparent crystal substrate 2 made of, e.g., sapphire ($Al_2O_3$). In the case of charging the transparent crystal substrate 2 with a function of the bearing layer having a thickness capable of being handled at the time of mounting the light-emitting device and an optical function, the minute unevenness structure 21 for preventing the multiple reflection are formed on the other surface (upper surface in FIG. 4A) of the transparent crystal substrate 2.

Figure 4B:
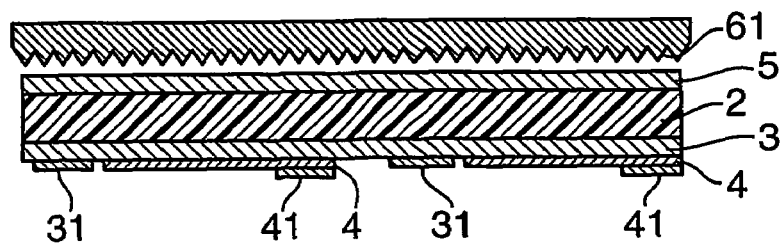

As shown in FIG. 4B, a resist (e.g., PMMA: methacrylic resin, Novolac resist) as a material of a transfer layer 5 is so spin-coated on the other surface of the transparent crystal substrate 2 as to have a thickness of about 1 μm and softened by being heated at a glass transition temperature Tg of the PMMA or higher (transfer layer forming step).

Figure 4C:
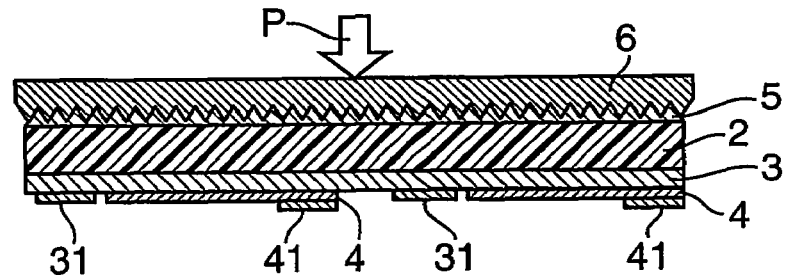

Subsequently, as shown in FIGS. 4B and 4C, a mold 6 formed with a minute unevenness structure 61 having pitches of about 1 μm is pressed at a pressure P of 4 MPa, thereby transferring the minute unevenness structure 61 of the mold 6 to the transfer layer 5 made of PMMA (transferring step).

Figure 4D:
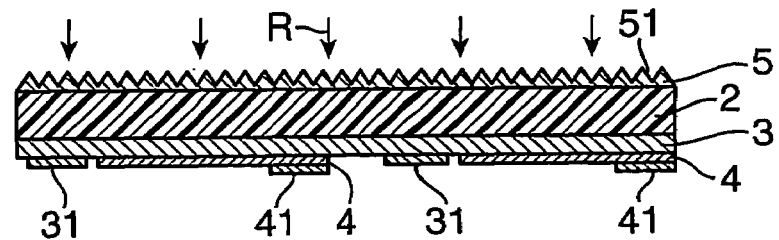
Figure 4E:
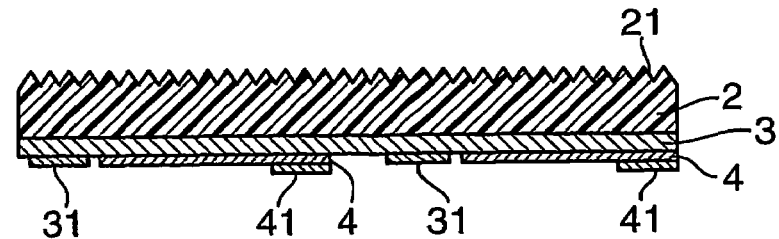
Figure 4F:
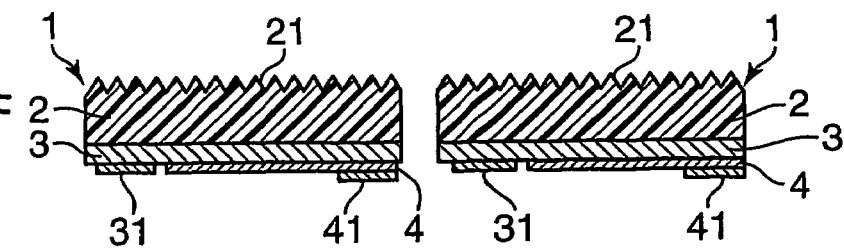

Thereafter, the mold 6 is separated from the transfer layer 5 in which the PMMA is cooled and solidified, and etching using reactive ions (RIE) is carried out as shown in FIG. 4D to etch the transfer layer 5 up to a backing layer (transparent crystal substrate 2) for the transfer layer 5. Then, as shown in FIG. 4E, the minute unevenness structure 21 for preventing multiple reflection can be formed in the transparent crystal substrate 2 of the light-emitting device 1 based on the minute unevenness structure 51 transferred to the transfer layer 5 (multiple-reflection preventing structure forming step). Thereafter, a plurality of light-emitting devices 1 integral to each other are divided into individual ones by cutting the substrate, thereby obtaining the individual light-emitting devices 1 as shown in FIG. 4F.

Although two light-emitting device chips 1 are produced on a wafer for the sake of simplification in FIG. 4 in the process, a wafer having a multitude of light-emitting device chips 1 may also be produced. This simplification is the same as the following respective processes.

By the pressing using the mold 6 and the succeeding etching as described above, a large area (entire substrate) can be inexpensively processed in bulk similar to the production of CDs (compact discs), and the mass production of the light-emitting devices 1 provided with the minute unevenness structure 21 for preventing the multiple reflection is possible. Further, a three-dimensional minute unevenness structure 21 having the shape of a pyramid or any arbitrary shape can be formed, whereby the total reflection loss can be effectively reduced to improve the light extraction efficiency of the light-emitting device 1.

Next, a brief overview of the production process flow of the light-emitting device 1 provided with the minute unevenness structure for preventing the multiple reflection is described with reference to FIG. 5.

The production process proceeds as follows. As partly described above, a plurality of light-emitting devices 1 are first formed on the transparent crystal substrate 2 by adhering the light-emitting layer comprised of the semiconductor layers 3, 4 (Step S1). Subsequently, the transfer-layer material is arranged (#10) and is softened (#20) in the transfer-layer forming step (Step S2). In the transferring step (Step S3), the mold 6 having the minute unevenness structure 61 is placed on the transfer-layer material (#30), the mold 6 is pressed against the softened layer to transfer the minute unevenness structure 61 (#40), the softened layer is solidified to fix the minute unevenness structure 61 (#50), and the mold 6 is separated from the transfer-layer material (#60).

Further in the multiple-reflection preventing structure forming step (S4), the transfer-layer material having the minute unevenness structure 61 transferred thereto is etched from the above up to the backing layer (transparent crystal substrate 2), whereby the minute unevenness structure 21 for preventing the multiple reflection are formed on the backing layer (transparent crystal substrate 2) as in case 1 of #70. In some cases, the multiple-reflection preventing structure forming step (S4) is completed in the transferring step (S3). In such cases, the transfer layer 5 having the minute unevenness structure 51 transferred and fixed thereto prevents the multiple reflection as in case 2 of #70.

Finally, the transparent crystal substrate 2 having a plurality of light-emitting devices 1 formed thereon is cut to obtain the individual light-emitting devices 1 (Step S5).

Figure 5:
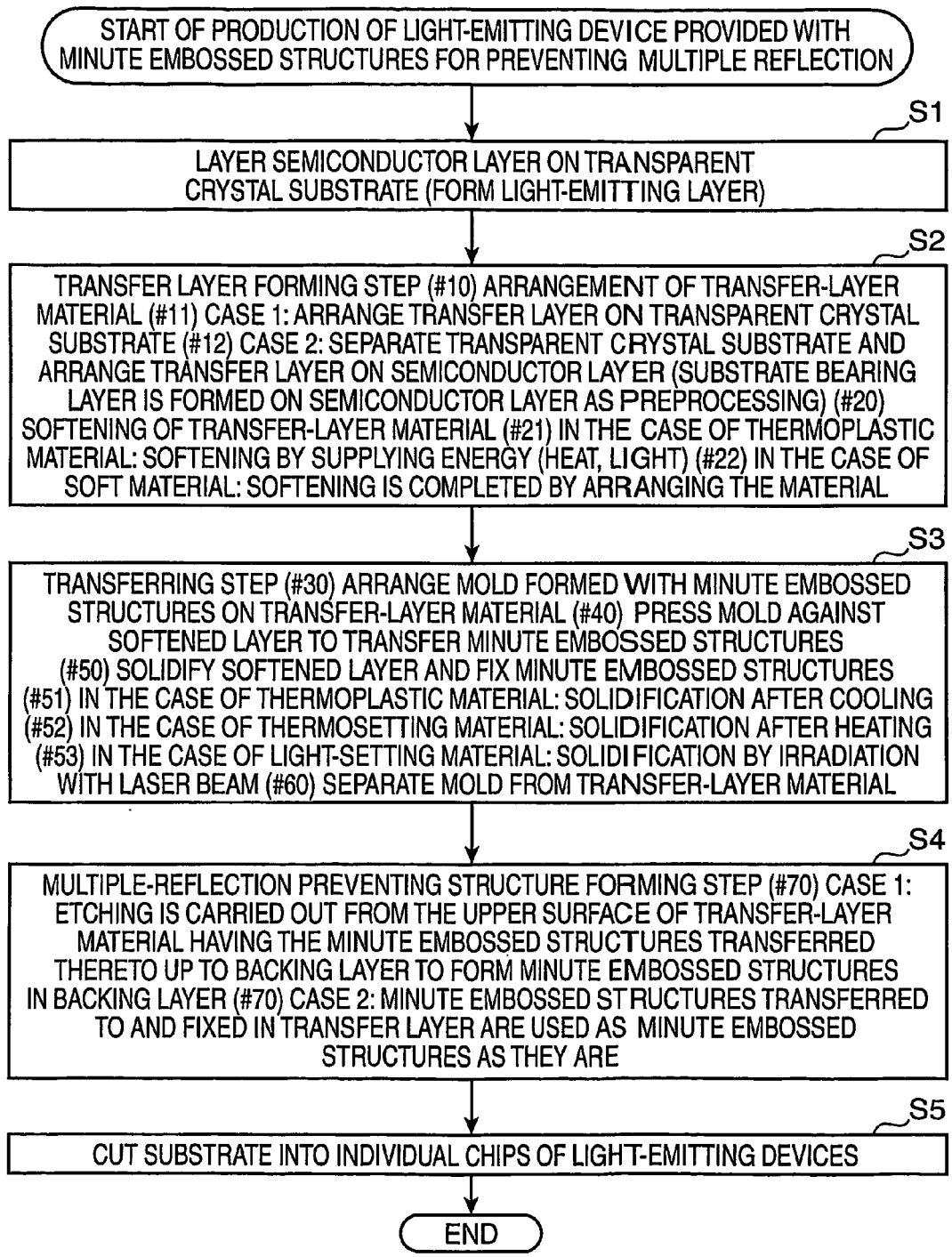
FIG. 5 is a flowchart showing a brief overview of operation steps of the method for producing the light-emitting device.

In the respective operation steps described above, there are various choices as to the position of the minute unevenness structure to be formed for preventing the multiple reflection, the selection of the material to be softened, the softened-layer forming means and the like as shown in FIG. 5. A combination of operation steps and a production method other than those shown in FIG. 5 may be used. Some of them will be described later.

FIG. 5 is described in more detail. An example of the "arrangement of the transfer-layer material on the transparent crystal substrate in case 1 (#11)" in the "arrangement of transfer-layer material (#10)" is the light-emitting device 1 shown in FIGS. 1 and 4. An example of the "arrangement of the transfer-layer material on the semiconductor layer in case 2 (#12)" is the light-emitting device 1 shown in FIG. 10, and a production process therefor is described later. Further, examples of the "arrangement of the transfer-layer material on the semiconductor layer by separating the transparent crystal substrate in case 3 (#13)" are the light-emitting devices 11, 11a shown in FIGS. 2 and 3, and production processes therefor are described later with respect to FIG. 11 and other figures.

In the "softening of the transfer-layer material (#20)", the material in solid state is softened, for example, by supplying heat and light energy of a laser beam in "the case of a thermoplastic material (#21)", whereas softening is completed by arranging the material in "the case of a soft material (#22)". Since the resin is subject to alteration and the like depending on the transfer-layer material used, the softening method is not limited to these two methods.

In the "solidification of the softened layer and fixation of the minute unevenness structure (#50)" of the transferring step (S3), the softened layer is solidified by being cooled in "the case of a thermoplastic material (#51); it is solidified by being heated, for example, with a laser beam in an infrared range in "the case of a thermosetting material (#52); and it is solidified by being irradiated, for example, with a laser beam in an ultraviolet range in "the case of a light-setting material (#53).

Next, the production process for the light-emitting device 1 by a production method as a modification of the first embodiment is described with reference to FIGS. 4A to 4B.

In the operation step of FIG. 4B, a silicon ($SiO_2$) organic solvent is applied to the upper surface of the transparent crystal substrate 2 to have a thickness of about 2 μm using a spin coater, thereby forming the transfer layer (resist) 5. This transfer layer 5 may be partly formed on the surface of the transparent crystal substrate 2 instead of being entirely formed.

Here, the silicon organic solvent is a solution containing an alcohol, an ester, a ketone or a mixture of two or more of these, and a silicon alkoxide component [$RnSi (OH)4_{-n}$] (where R is H or alkyl group, n=integer of 0 to 3), specifically, a solution containing TEOS, TMOS or the like. Further, there may be provided the so-called SOG that is an inter-layer insulating film material.

Subsequently, the mold 6 formed with the minute unevenness structure 61 are placed on the transfer layer 5 of the transparent crystal substrate 2. This mold 6 is wet-etched to form pyramid-shaped projections (or recesses) in rows and columns at pitches of about 3.5 μm, thereby forming the minute unevenness structure 61. The minute unevenness structure 61 may be formed by recesses or projections having the shape of a triangular pyramid, a six-sided pyramid or other polygonal pyramid, a cylindrical shape, a conical shape or a semispherical shape in addition to the shape of a quadrangular pyramid.

Then, the mold 6 is pressed against the transfer layer at a pressure (pressing) of, e.g., 90 MPa as shown in FIG. 4C. At this time, since the transfer layer 5 is in a liquid state (softening) at room temperature without being set, the silicon organic solvent of the transfer layer 5 gets into the minute unevenness structure 61 of the mold 6.

Thereafter, when the mold 6 is separated from the half-set transfer layer 5, the minute unevenness structure 51 having the shape of an inverted quadrangular pyramid are transferred to the transfer layer 5.

In the operation step of FIG. 4D, when dry etching is carried with a chlorine gas until the transfer layer (resist) 5 disappears using the transfer layer 5 before a state where the minute unevenness structure 51 transferred thereto completely turn into $SiO_2$ as a resist mask, the minute unevenness structure 21 having the shape of an inverted quadrangular pyramid is transferred to the transparent crystal substrate 2.

Thereafter, the wafer is cut into chips of the individual light-emitting devices 1, which are supplied for a mounting step.

If the light-emitting device 1 is produced by the production method as a modification of the first embodiment, dry etching is carried out with the chlorine gas using the transfer layer 5 before being completely set as a resist mask after the minute unevenness structure 61 of the mold 6 are transferred to the transfer layer 5 of the silicon organic solvent (hot embossing/imprinting), whereby the minute unevenness structure 21 can be formed in the transparent crystal substrate 2. Thus, the total reflection loss can be reduced to improve the light extraction efficiency. Since the transfer layer 5 before being completely turned into $SiO_2$ is also etched, an operation step of removing residuals of the transfer layer 5 is not necessary.

As described above, the light-emitting devices 1 having the minute unevenness structure 21 formed on the transparent crystal substrate 2 can be inexpensively mass-produced in a large area similar to the production of CDs and the like even by the production method (production process) according to the first embodiment and the production method (production process) according to the modification of the first embodiment.

Next, the mold 6 for transferring the minute unevenness structure are described. The mold 6 is a silicon (Si) mold 6(A) whose minute unevenness structure 61 is comprised of recesses having the shape of a quadrangular pyramid and formed by etching in FIGS. 6A to 6C, whereas the mold is a metal mold 6(B) whose minute unevenness structure 61 is comprised of projections having the shape of a quadrangular pyramid and formed by cutting in FIGS. 7A to 7C. It should be noted that the silicon mold 6(A) may be formed with the minute unevenness structure 61 comprised of projections and the metal mold 6(B) may be formed with the minute unevenness structure 61 comprised of recesses. In FIGS. 6 and 7, the semiconductor layers 3, 4 are not shown.

The minute unevenness structure 51 comprised of projections having the shape of a quadrangular pyramid are formed in the transfer layer 5 as shown in FIG. 6B if the silicon mold 6(A) of FIG. 6A is used, and the minute unevenness structure 21 comprised of projections having the shape of a quadrangular pyramid are formed in the light-emitting surface of the transparent crystal substrate 2 as shown in FIG. 6C.

When the silicon mold 6(A) is pressed against the transfer layer 5 provided on the surface of the transparent crystal substrate 2 and then removed after the transfer layer 5 is set, the transferred minute unevenness structure 51 can be obtained in the outer surface of the solidified transfer layer 5 as shown in FIG. 6B.

Subsequently, when etching corresponding to thickness d of the transfer layer 5 is carried out as shown in FIG. 6B1, the minute unevenness structure 21 for preventing the multiple reflection are formed in the transparent crystal substrate 2 as shown in FIGS. 6C and 6C1. The transfer layer 5 is etched using, for example, an oxygen ($O_2$) plasma until the transparent crystal substrate 2 as a backing appears. Thereafter, reactive ion etching (RIE) for etching the transfer layer 5 and the transparent crystal substrate 2 at the same speed is carried out, thereby enabling a processing having a high fidelity (the minute unevenness structure 21 of the transparent crystal substrate 2 precisely reflect the minute unevenness structure 61 of the mold 6) in transferring the minute unevenness structure to be carried out at a high speed.

Similar to the case of the silicon mold 6(A), the minute unevenness structure 51 comprised of the recesses having the shape of a quadrangular pyramid are formed in the transfer layer 5 as shown in FIGS. 7B and 7B1 in the metal mold 6(B) of FIG. 7A, and the minute unevenness structure 21 comprised of the recesses having the shape of a quadrangular pyramid are formed in the transparent crystal substrate 2 as shown in FIGS. 7C and 7C1.

If the pitches of the minute unevenness structure 61 of the mold 6 are up to 1 μm, the metal mold 6(B) can be fabricated by machine-cutting a metallic material. In the case of machine processing, the metal mold 6(B) formed with the minute unevenness structure 61 comprised of the projections having the shape of a pyramid whose apex angle is arbitrarily set as shown in FIG. 7A can be fabricated by processing the shape of the cutting edge of a bit. The minute unevenness structure 21 of the transparent crystal substrate 2 are formed using the mold 6 having such projections in a manner similar to the one described with reference to FIG. 6. Further, the silicon mold 6(A) having the projections can be obtained by fabricating a replica mold having an inverted unevenness pattern from the aforementioned silicon mold 6(A) by electrocasting.

In the case of the silicon mold 6(A), the shape dependent on the crystal orientation can be precisely formed. In the case of the metal mold 6(B), recesses or projections having the shape of a triangular pyramid, a quadrangular pyramid or a rectangle or any arbitrary shape can be formed. Thus, the minute unevenness structure 21 having any arbitrary shape in conformity with required optical characteristics can be formed in the transparent crystal substrate 2 by selecting these.

Although the above description is made on the formation of the minute unevenness structure 21 in the transparent crystal substrate 2, a similar production process is carried out to form the minute unevenness structure 34 in the semiconductor layers 3, 4 as described later.

Figure 8A:
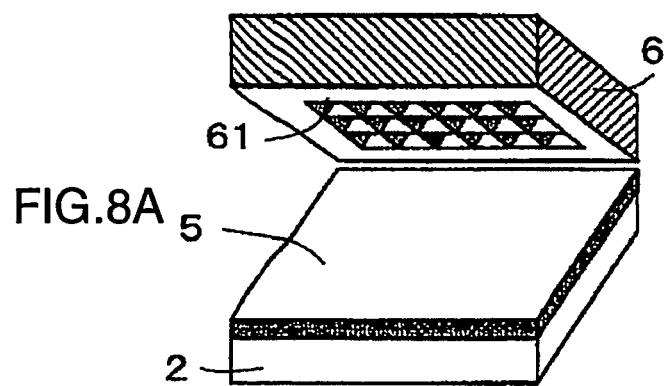
FIGS. 8A and 8B are perspective views showing a production process of the light-emitting device according to one embodiment of the invention.
Figure 8B:
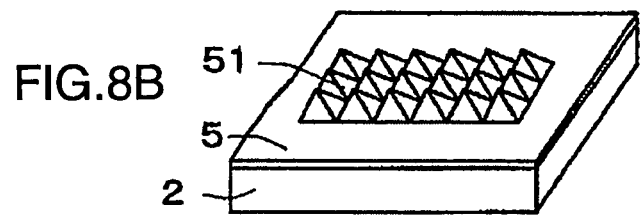
Figure 8C:
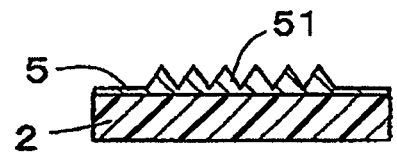
FIG. 8C is a section of FIG. 8B.

Next, production processes having simplified operation steps are described with reference to FIGS. 8 and 9. The production processes described here correspond to the "case 2 (#70)" of Step S4 in FIG. 5. As shown in FIG. 8A, using a sapphire (refractive index n=1.77) as the transparent crystal substrate 2, a polymer having a refractive index n of about 1.7, for example, Anterior (n=1.74) produced by Mitsui Chemicals Inc. or an inorganic/organic hybrid material is applied to the outer surface of the sapphire to form the transfer layer 5. When the transfer layer 5 having the minute unevenness structure 61 of the mold 6 transferred thereto by imprinting is solidified, the minute unevenness structure 51 are formed in the transfer layer 5 as shown in FIGS. 8B and 8C.

FIG. 9 show a minute unevenness structure 61 comprised of projections different from the minute unevenness structure 61 of the mold 6 comprised of the recesses in FIG. 8, and no detailed description is given thereon.

Since the refractive indices of the transparent crystal substrate 2 and the transfer layer 5 are set to be substantially equal, the minute unevenness structure 51 can prevent the multiple reflection while being left as it is. The production process can be simplified by this method, whereby the light extraction efficiency of the light-emitting device 1 can be improved at lower costs.

FIG. 10 show an example of the "(#12) case 2: arrangement on the semiconductor layers" of FIG. 5, i.e., show a production method according to which upper flat surfaces 5c and lower flat surfaces 5d are formed when forming the minute unevenness structure 34 in the semiconductor layers 3, 4 of the light-emitting device 1, and electrode-forming portions are formed on an upper semiconductor layer (p-type GaN semiconductor layer) 4 and a lower semiconductor layer (n-type GaN semiconductor layer) 3 by etching.

Figure 10A:
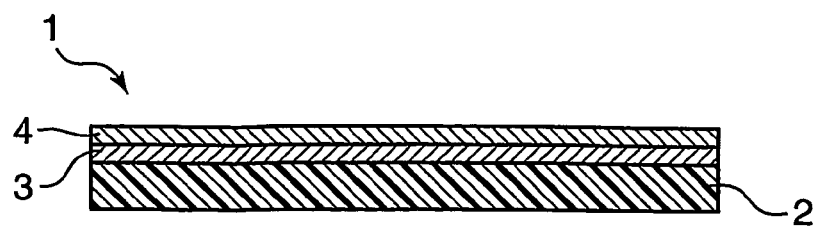
FIGS. 10A to 10E are diagrams showing operation steps of the production method according to the first embodiment for forming a minute unevenness structure in a semiconductor layer.

As shown in FIG. 10A, the light-emitting device 1 in which neither the electrode 31 nor the electrode 41 is formed on the semiconductor layer 3, 4 is prepared. An upper one of this semiconductor layer 3, 4 is the p-type GaN semiconductor layer (upper semiconductor layer) 4 and a lower one thereof is the n-type GaN semiconductor layer (lower semiconductor layer) 3.

Figure 10B:
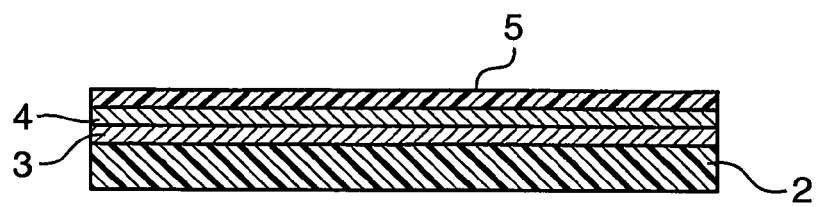

In an operation step of FIG. 10B, a silicon organic solvent is applied to the p-type GaN semiconductor layer 4 by a spin coater to form the transfer layer (resist) 5 with the semiconductor layer 3, 4 of the light-emitting device 1 faced up. This transfer layer 5 may be partly formed on the surface of the p-type GaN semiconductor layer (upper semiconductor layer) 4 instead of being entirely formed.

Figure 10C:
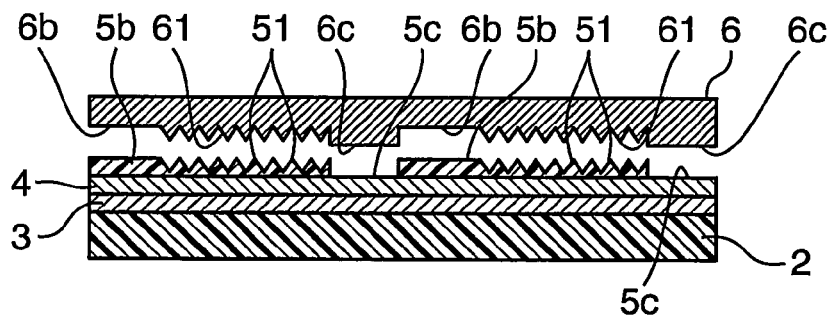

In an operation step of FIG. 10C, the mold 6 formed with the minute unevenness structure 61 are arranged at a side of the p-type GaN semiconductor layer 4 toward the transfer layer 5. This mold 6 includes upper flat portions 6b to be located near the bottom of the minute unevenness structure 61 and lower flat portions 6c to be located at positions lowered from the upper flat portions 6b by about the thickness of the p-type GaN semiconductor layer 4.

When the mold 6 is pressed against the transfer layer 5 and then the mold 6 in a partly-set state is separated from the transfer layer 5, the minute unevenness structure 51 are transferred to the transfer layer 5 and the upper and lower flat portions 5b, 5c are formed.

Figure 10D:
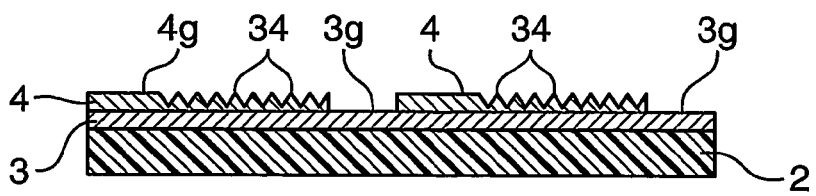

In an operation step of FIG. 10D, dry etching is carried out with a chlorine gas using the transfer layer 5 as a resist mask until the transfer layer (resist) 5 disappears. Then, the minute unevenness structure 34 is transferred to the p-type GaN semiconductor layer 4.

Here, since the p-type GaN semiconductor layer 4 generally has a thickness of several hundreds of nm, the depth of the minute unevenness structure 34 is about half the thickness of the p-type GaN semiconductor layer 4 if a selection ratio of the chlorine gas is about 1. If dry etching is carried out with a chlorine gas having a selection ratio of about 1, the upper surface of the p-type GaN semiconductor layer 4 is exposed as electrode forming portions 4g at portions corresponding to the upper flat surfaces 5b, whereas the p-type GaN semiconductor layer 4 is also etched at portions corresponding to the lower flat surfaces 5c to expose the upper surfaces of the n-type GaN semiconductor layer 3 as electrode forming portions 3g.

Figure 10E:
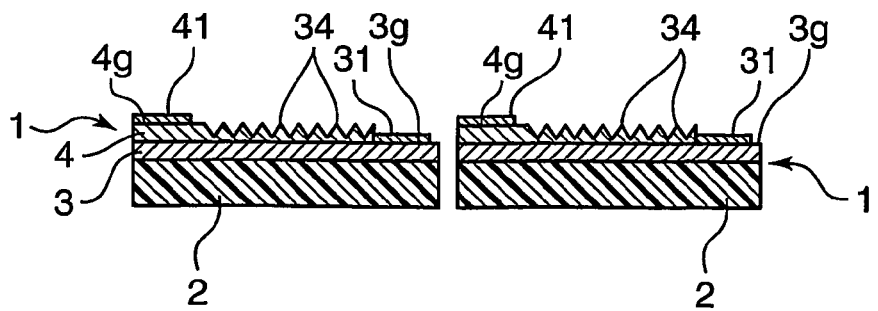

In an operation step of FIG. 10E, after the electrodes 31, 41 are formed on the respective electrode-forming portions 4g, 3g, the wafer is cut into chips of the individual light-emitting devices 1, which are supplied for a mounting step.

Since the minute unevenness structure 34 can be formed in the semiconductor layers 3, 4 in this light-emitting device 1, the total reflection loss can be reduced to improve a light extraction efficiency similar to the case where the minute unevenness structure 21 is formed in the transparent crystal substrate 2.

Further, since the minute unevenness structure 34 in the semiconductor layers 3, 4 and the electrode forming portions 3g, 4g can be formed in the same operation step, the production process can be simplified, contributing to lower production costs.

Next, the production process of the light-emitting device 11 by the production method of the second embodiment is described with reference to FIGS. 11A to 11I.

The light-emitting device 11 shown in FIG. 11 is constructed such that a light-emitting layer comprised of an n-type GaN semiconductor layer 3 and a p-type GaN semiconductor layers 4 is adhered to one surface (lower surface in FIG. 11) of the transparent crystal substrate 2 made of, e.g., sapphire (Al$_2$O$_3$). As shown in FIG. 11B, a resin coated copper (RCC) 70 including a resin layer 71 and a copper foil 72 is adhered to the outer surfaces of the semiconductor layers 3, 4. Thereafter, VIA formation, patterning, plating and the like which are ordinary printed circuit board processing steps are applied to the resin coated copper 70, thereby forming a light-emitting device provided with a substrate bearing layer 7 as shown in FIG. 11C.

The substrate bearing layer 7 includes the resin layer 71 for bearing the semiconductor layers 3, 4, mounting-surface electrodes 32, 42, and electrode connecting paths 33, 43 for electrically connecting the electrodes 32, 42 and electrodes 31, 41 on the surfaces of the semiconductor layers so that currents can be introduced from the mounting-surface electrodes 32, 42 to the electrodes 31, 41. The substrate bearing layer 7 is suitably used for surface mounting. It should be noted that the substrate bearing layer 7 may be formed by plating silicon, gold or other metal to an insulating portion to form a thick film.

Subsequently, as shown in FIG. 11D, the semiconductor layer 3 is irradiated, for example, with an excimer laser beam LB through the transparent crystal substrate 2, whereby GaN is decomposed to separate the transparent crystal substrate 2, thereby exposing an outer surface S of the semiconductor layer 3. The GaN layers having separated from the transparent crystal substrate 2 have a small thickness of several μm. Thus, the substrate bearing layer 7 is used to prevent the GaN layers from being broken during the handling in the separating process and the mounting process after the separation.

Ga is present on the outer surface S of the GaN layer after the transparent crystal substrate 2 is separated and removed. Ga is washed by an acid, alkalis or the like to expose the GaN layer. Thereafter, as shown in FIGS. 11E to 11I, a resist such as PMMA or SOG (Spin On Glass) is applied to the exposed outer surface of the GaN layer to form the transfer layer 5, and operating steps similar to those described with reference to FIGS. 4A to 4F are carried out to obtain the light-emitting devices 11.

The mold 6 used in these operation steps is a mold capable of transferring a pyramid-shaped minute unevenness structure 61, for example, arranged at intervals of 1000 to 2000 μm. This mold may be a metal mold fabricated by machine cutting or a silicon mold fabricated by etching. Alternatively, replica molds of these molds fabricated by electrocasting may be used.

In this light-emitting device 11, the transparent crystal substrate 2 can be separated from the semiconductor layers 3, 4 by mounting the substrate bearing layer 7 on the semiconductor layers 3, 4, and the minute unevenness structure 34 can be formed in the semiconductor layers 3, 4 having the transparent crystal substrate 2 separated therefrom. Thus, the total reflection loss can be reduced to improve the light extraction efficiency. Particularly, the semiconductor layers 3, 4 have a thickness of several μm and, accordingly, are easy to break during the handling at the time of separating the transparent crystal substrate 2 and mounting after the separation. However, such a problem can be solved by mounting the substrate bearing layer 7 after the separation.

On the other hand, in the case that the resist mask is the transfer layer 5 obtained by applying the silicon organic solvent and the outer surfaces to be processed are those of the semiconductor layers 3, 4 as according to the production method for the light-emitting device 11, the following was found out. If BCl$_3$, Ar or the like is added as an additive gas to the chlorine gas (Cl$_2$), the selection ratio [i.e., ratio of the etching speed of the semiconductor layers 3, 4 to that of the resist (transfer layer 5)] can be adjusted within a range of 0.5 to 4 depending on a mixing ratio, and an aspect ratio 0.5 to 4 times as much as those of the minute unevenness structure 61 of the mold 6 and the minute unevenness structure 51 of the transfer layer 5 can be obtained.

Figure 12A:
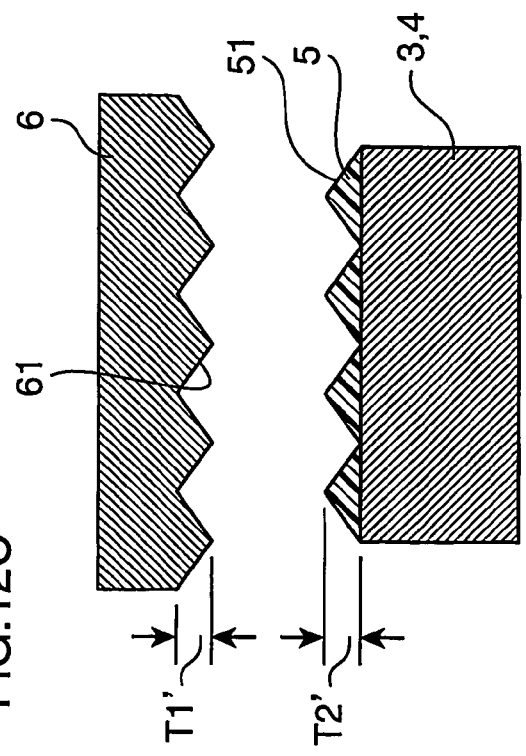
FIGS. 12A to 12D are diagrams showing the light-emitting device production method according to the second embodiment of the invention, wherein a step of adjusting a selection ratio is included in an etching step.
Figure 12B:
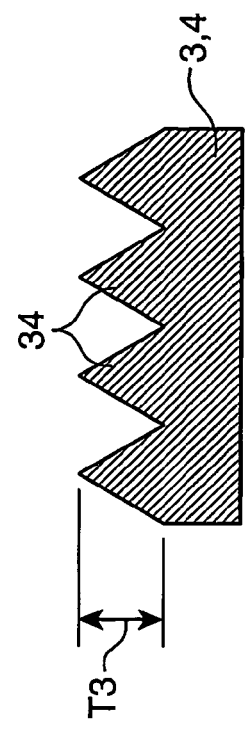

If the selection ratio is set at "1" as shown in FIGS. 12A and 12B, depth T1 of the minute unevenness structure 61 of the mold 6, depth T2 of the minute unevenness structure 51 of the transfer layer (resist mask) 5 and depth T3 of the minute unevenness structure 34 of the semiconductor layers 3, 4 are all equal to each other (T1=T2=T3). In the case of the shape based on a mold fabricated by wet etching taking advantage of the crystal orientation of silicon (Si), this selection ratio is more preferably set to "1" due to required optical characteristics.

Figure 12C:
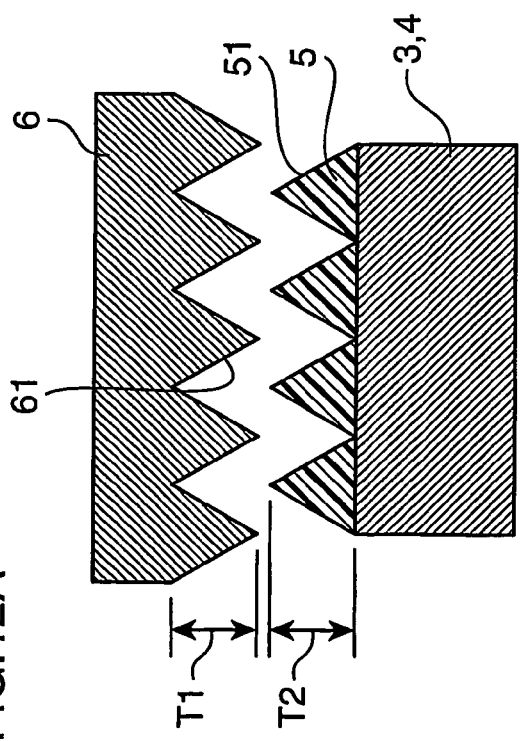
Figure 12D:
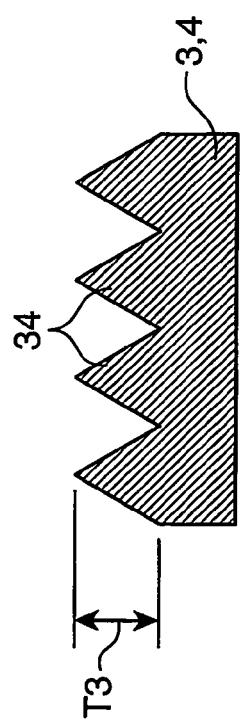

Contrary to this, if the minute unevenness structure 61 of the mold 6 has depth T1' (about ½ of T1) and the minute unevenness structure 51 of the transfer layer (resist mask) 5 has depth T2' (about ½ of T2) in the case of setting the selection ratio at "2" as shown in FIGS. 12C and 12D, the depth of the minute unevenness structure 34 of the semiconductor layers 3, 4 after dry etching is T3 which is about twice the depths T1' and T2' (T1'=T2'<T3).

Accordingly, if the selection ratio is set at "2", the depth T1' of the minute unevenness structure 61 of the mold 6 is only about ½ of the depth T1 in the case of setting the selection ratio at "1", and the depth T2' of the minute unevenness structure 51 of the transfer layer (resist mask) 5 is only about ½ of the depth T2 (i.e., thickness of the transfer layer 5) in the case of setting the selection ratio at "1". Thus, the mold 6 can be more easily fabricated due to fewer burrs and the silicon organic solvent for the transfer layer 5 can be economized. Further, if the selection ratio is set at "2", the etching speed is faster than in the case of setting it at "1", wherefore etching can be carried out within a shorter period of time.

Figure 13A:
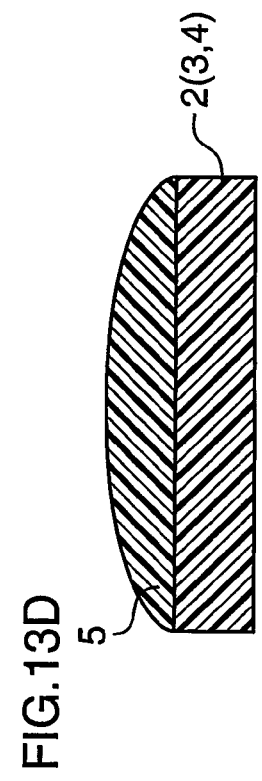
FIGS. 13A to 13F are diagrams showing the light-emitting device production method according to the second embodiment of the invention, wherein a step of applying a silicon organic solvent by potting or spray coating is included in a step of forming a transfer layer by applying the silicon organic solvent.

In the case of forming the transfer layer 5 by applying the silicon organic solvent to the transparent crystal substrate 2 or the semiconductor layers 3, 4 as shown in FIG. 13A, it is difficult to apply the silicon organic solvent to have a thickness of 1 μm or larger by spin coating if the silicon organic solvent is a hydrogen silsesquioxane polymer [e.g., HSQ (product name: FOX) produced by Dow Corning Corporation].

Figure 13B:
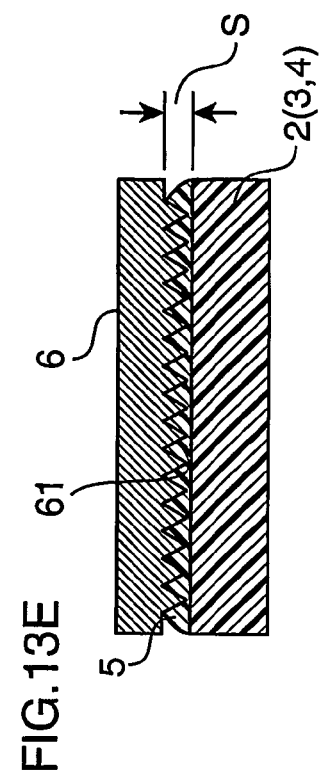
Figure 13C:
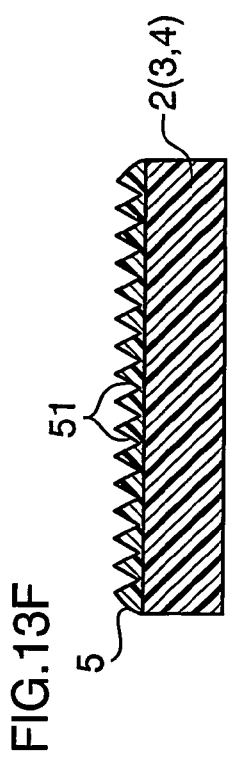

Accordingly, when an application thickness of about 2 μm is required as shown in FIGS. 13B and 13C, the minute unevenness structure 61 of the mold 6 cannot be precisely transferred to the transfer layer 5 since the minute unevenness structure 61 of the mold 6 has a depth of about 2 μm and only the application thickness of about 1 μm can be obtained by spin coating.

Figure 13D:
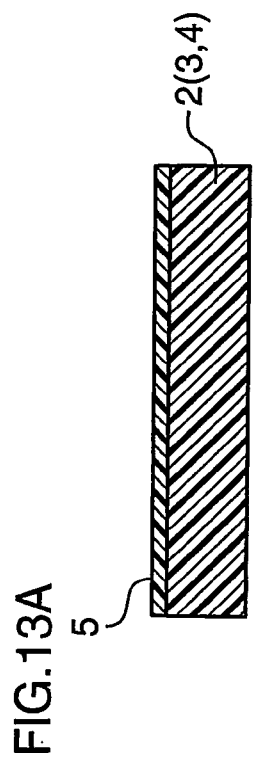
Figure 13E:
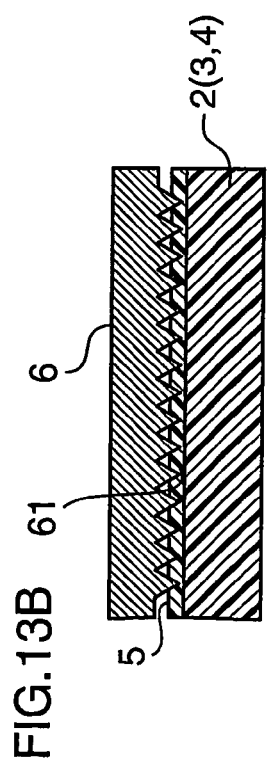
Figure 13F:
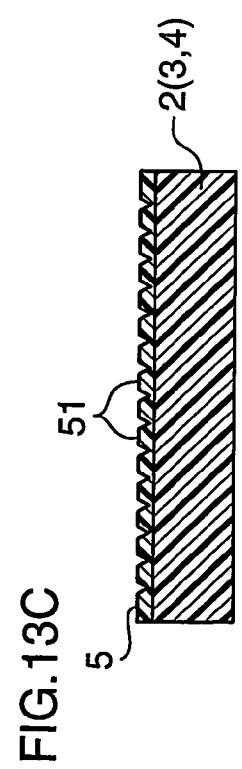

Thus, if the silicon organic solvent is applied to the transparent crystal substrate 2 or the semiconductor layers 3, 4 by potting or spray coating to form the transfer layer 5 as shown in FIG. 13D, the minute unevenness structure 61 of the mold 6 can be precisely transferred to the transfer layer 5 as shown in FIGS. 13E and 13F since an application thickness of 2 μm or larger can be obtained by potting or spray coating.

Specifically, the transfer layer 5 applied by potting or spray coating is in a liquid (softened) state at room temperature because it is not set. Thus, when the mold 6 is pressed against the transfer layer 5, the silicon organic solvent of the transfer layer 5 gets into the minute unevenness structure 61 of the mold 6.

The mold 6 may be pressed at a low pressure while controlling a pressing stroke or may be pressed using an apparatus for controlling a spacing S between the mold 6 and the transfer layer 5.

A pressing pressure at which the mold 6 is pressed is preferably 5 MPa or higher and 150 MPa or lower in the production method for the light-emitting device 11.

Specifically, the mold 6 may be pressed at a pressure of 150 MPa or higher if the shape is merely transferred using the mold 6. However, in the case of semiconductors, particularly the light-emitting device 11 (as well as the light-emitting devices 1, 11a), the semiconductor layers 3, 4 may be damaged to deteriorate a light-emitting characteristic if the pressing pressure exceeds 150 MPa.

Thus, a damage of the semiconductor layers 3, 4 of the light-emitting device 11 can be reduced by setting the pressing pressure of the mold 6 at 5 MPa or higher and 150 MPa or lower.

Figure 14A:
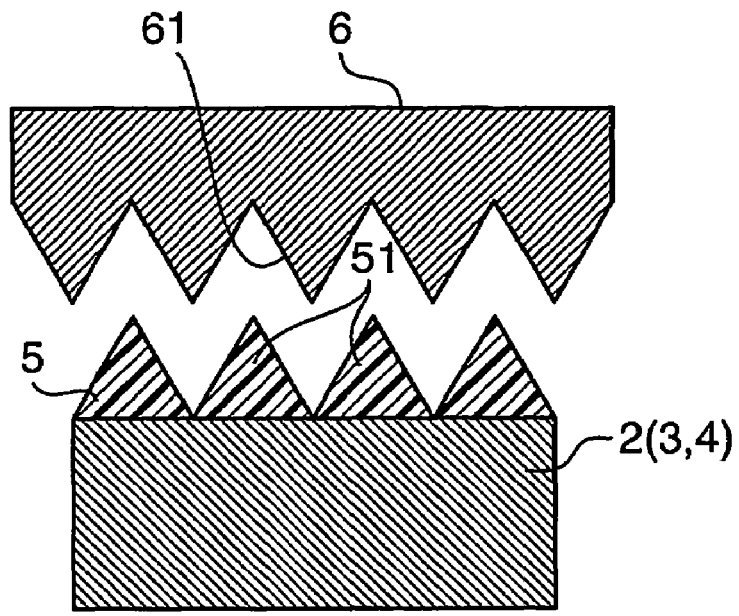
FIGS. 14A and 14B are diagrams showing the light-emitting device production method according to the second embodiment of the invention, wherein a post-baking step is carried out before dry etching after the minute unevenness structure of a mold is transferred to the transfer layer.

In the production method of the light-emitting device 11, after the minute unevenness structure 61 of the mold 6 is transferred to the transfer layer 5, post-baking is preferably applied at or below 120° C. before dry etching as shown in FIG. 14A.

Specifically, if the transfer layer 5 is baked at or below 120° C., the transfer layer 5 is turned into $SiO_2$ at a faster rate of progress, and the selection ratio can be set at "10" or larger. The transfer layer 5 in this case can be used as a resist mask for merely processing the rectangular unevenness structure, but it is difficult to form the minute unevenness structure 21 in the transparent crystal substrate 2 and form the minute unevenness structure 34 in the semiconductor layers 3, 4 by also etching the resist.

Accordingly, the selection ratio can be adjusted between "5 and 10" by post-baking the transfer layer 5 at or below 120° C. since the transfer layer 5 is set, but not completely turned into $SiO_2$.

Figure 14B:
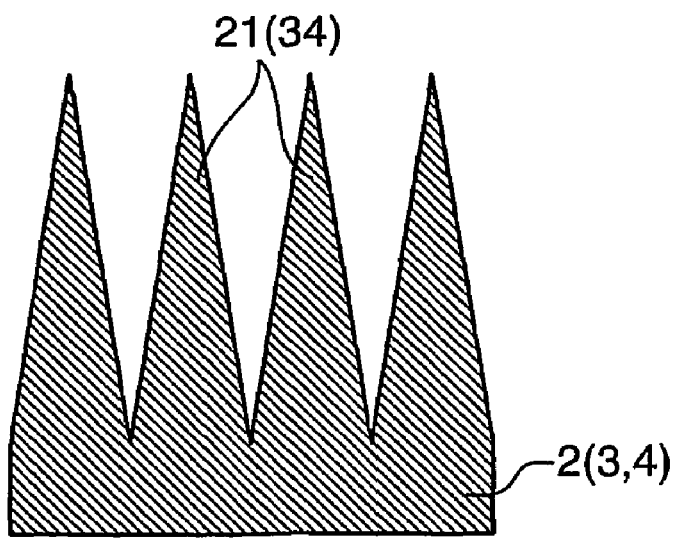

Thus, in the case that the minute unevenness structure 21 of the transparent crystal substrate 2 and the minute unevenness structure 34 of the semiconductor layers 3, 4 is desired to be formed at a high aspect ratio, the minute unevenness structure 61 of the mold 6 is transferred to the transfer layer 5 at a low aspect ratio and etching is carried out after the transfer layer 5 is post-baked at or below 120° C. when the transfer layer 5 cannot be formed to have a large thickness. Then, as shown in FIG. 14B, the minute unevenness structure 21 of the transparent crystal substrate 2 and the minute unevenness structure 34 of the semiconductor layers 3, 4 can be formed at a high aspect ratio.

For example, if the pitch of the minute unevenness structure 61 of the mold 6 is 100 to 300 nm, resistance to etching can be increased by transferring the minute unevenness structure 51 to the transfer layer 5 made of a SOG material at an aspect ratio≈1 and post-baking the transfer layer 5 at about 100° C. for 5 min. after the transfer. As a result, the selection ratio can be set at a large value of about "10".

In this way, since the minute unevenness structure 21 of the transparent crystal substrate 2 and the minute unevenness structure 34 of the semiconductor layers 3, 4 can be formed at a high aspect ratio, a reflection preventing effect can be enhanced to improve the light extraction efficiency of the light-emitting device 11.

Figure 15A:
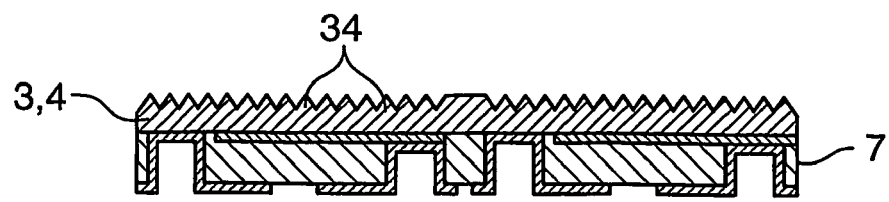
FIGS. 15A to 15D are diagrams showing a production process of the production method including a step of forming an unevenness structure larger than the minute unevenness structure on the minute unevenness structure for preventing the multiple reflection of the light-emitting layer.

On the other hand, if dry etching is carried out with a chlorine gas using the transfer layer 5 as a resist mask until the transfer layer (resist) 5 disappears as shown in FIG. 15A after the minute unevenness structure 51 is formed in the transfer layer 5 by the mold 6 in the operation step of FIG. 11F, the minute unevenness structure 34 is transferred to the semiconductor layers 3, 4.

Figure 15B:
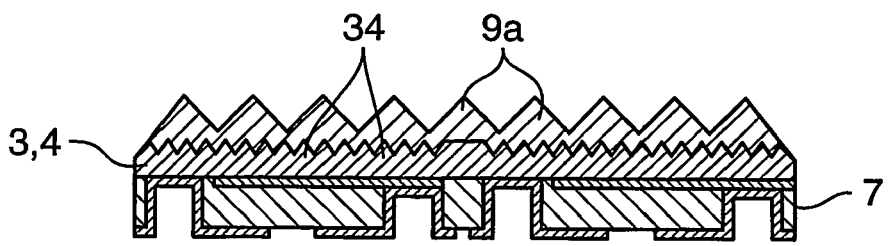

Thereafter, as shown in FIG. 15B, an unevenness structure 9a larger than the minute unevenness structure 34 is formed on the minute unevenness structure 34 of the semiconductor layers 3, 4 by LIGA, hot embossing or imprinting, and the wafer is cut into chips of the individual light-emitting devices 1, which are supplied for a mounting step.

Here, if the minute unevenness structure 34 of the semiconductor layers 3, 4 is a prism-shaped diffraction grating having pitches of 1000 to 3000 nm, the unevenness structure 9a formed thereon are prism-shaped and arranged at pitches of 10 to 50 μm, preferably pitches of 10 to 20 μm.

Figure 15C:
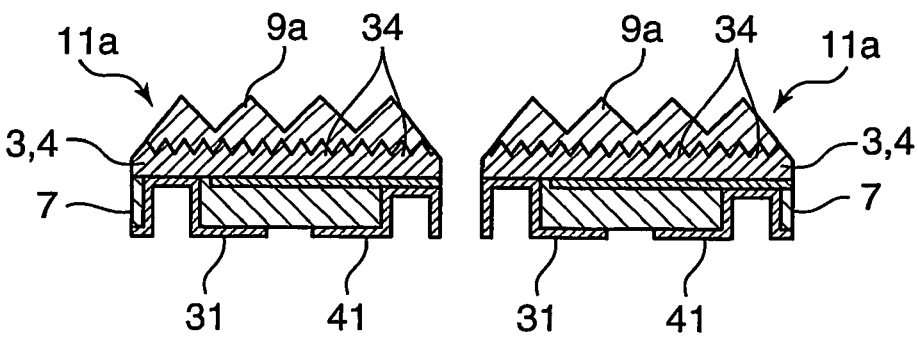
Figure 15D:
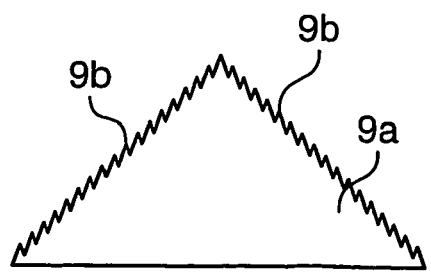

As one prism-shaped projection of the unevenness structure 9a is enlargedly shown in FIG. 15D, it is preferable to form a superminute unevenness structure 9b (e.g., pitches: 100 nm, height: 100 to 200 nm) in the outer surface of the unevenness structure 9a.

In order to form this superminute unevenness structure 9b, tungsten (W) is sputter-deposited on the inner surface of the mold for forming the unevenness structure 9a, and the superminute unevenness structure in the form of a tungsten thin film are transferred to the outer surfaces of the unevenness structure 9a using this mold. In other words, in the case of sputtering tungsten using an Ar (argon) plasma, tungsten having a column-shaped structure in the order of 100 nm is formed if sputtering is applied in such an atmosphere having a relatively large amount of Ar gas (500 W, 90 mTorr). The thus formed superminute unevenness structure 9b is also in the order of 100 nm.

Figure 16A:
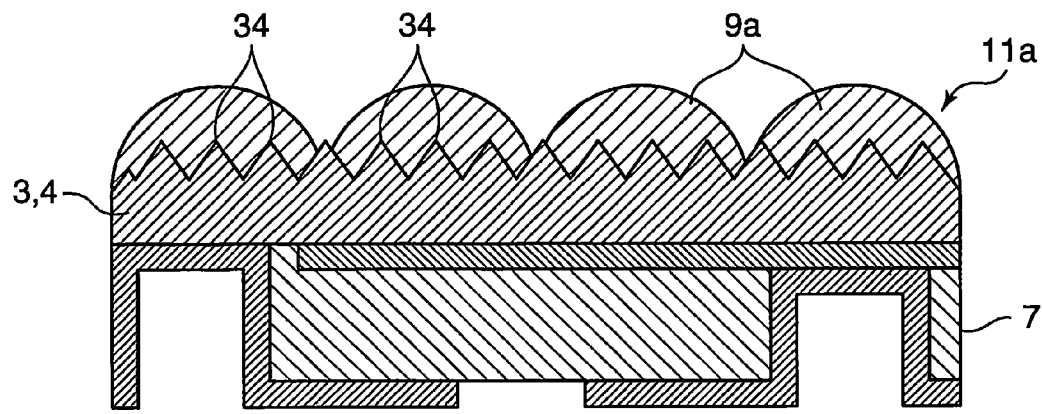
FIGS. 16A and 16B are sections of light-emitting devices in which the an unevenness structure of FIGS. 15A to 15D take the shape of a prism and a microlens, respectively.
Figure 16B:
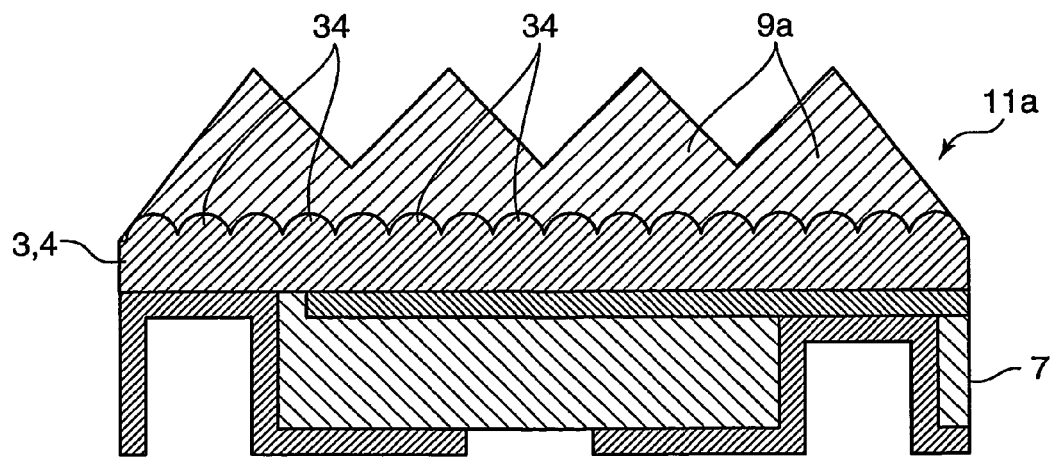

Although the prism-shaped minute unevenness structure 34 is formed in the semiconductor layers 3, 4 and the prism-shaped unevenness structure 9a are formed thereon in FIG. 15C, an unevenness structure 9a having the shape of a microlens may be formed on the prism-shaped minute unevenness structure 34 of the semiconductor layers 3, 4 as shown in FIG. 16A or prism-shaped unevenness structure 9a may be formed on the minute unevenness structure 34 of the semiconductor layers 3, 4 having the shape of a microlens as shown in FIG. 16B.

In this way, the unevenness structure 9a having a prism shape or other shape are formed on the prism-shaped minute unevenness structure 34 of the semiconductor layers 3, 4.

Therefore, a distribution of the emitted light can be gathered toward the upper surface (front surface), thereby contributing to an improvement of the frontal luminance.

Further, by forming the superminute unevenness structure 9b, which is a nonreflecting nanostructure, on the outer surfaces of the unevenness structure 9a, the Fresnel reflection loss at the outer surfaces of the superminute unevenness structure 9b can be reduced. Thus, coupled with the capability to gather the distribution of the emitted light toward the upper surface (front surface), the frontal luminance can be more improved.

As described above, a production method for producing a light-emitting device in which a light-emitting layer at least including a n-type semiconductor layer and a p-type semiconductor layer is layered on a transparent crystal substrate, comprises the steps of forming a transfer layer on at least a part of the transparent crystal substrate or the light-emitting layer, which transfer layer is softened or set upon supplying an energy thereto; pressing a mold formed with a minute unevenness structure against the transfer layer to transfer the minute unevenness structure to an outer surface of the transfer layer; and forming a minute unevenness structure for preventing multiple reflection based on the minute unevenness structure transferred to the transfer layer.

In the light-emitting device production method, after the minute unevenness structure of the mold is transferred to the transfer layer which is softened or set upon supplying an energy thereto, the minute unevenness structure for preventing the multiple reflection is formed in the transparent crystal substrate or the light-emitting layer based on the minute unevenness structure transferred to the transfer layer. Thus, a total reflection loss can be reduced to improve the light extraction efficiency.

Further, a three-dimensional minute unevenness structure having arbitrarily shape and size can be formed. A processing limit of forming the minute unevenness structure for preventing the multiple reflection is determined by a processing limit of the mold which does not dependent on the wavelength unlike a resolution limit to the wavelength of light in a lithographic exposure. Thus, more minute processing than lithography is possible. If the mold is a mechanically processed mold, a triangular pyramid, a quadrangular pyramid, a rectangle or any arbitrary shape is possible to form. Further in the case of a silicon (Si) mold, it can be precisely fabricated to have a shape dependent on crystal orientation. Arbitrary minute unevenness structure in conformity with required optical characteristics can be formed by a combination of these molds, whereby the light extraction efficiency of the light-emitting device can be improved. It may be appreciated to use a mold formed with a pattern by a usual lithographic exposure or electron beam as a master mold, according to a required shape or size.

Unlike etching and grinding, the minute unevenness structure can be controllably processed to have a good reproducibility. It is also possible to enlarge a degree of freedom in designing the minute unevenness structure, improve shape precision, and process a large area at lower costs.

Further, the production process can be simplified and the light extraction efficiency can be improved at low costs. Thus, similar to the production of CDs and the like, light-emitting devices formed with the minute unevenness structure for preventing the multiple reflection in the transparent crystal substrate (or light-emitting layer) can be inexpensively mass-produced in a large area (per wafer).

The step of forming the minute unevenness structure in the light-emitting layer may include a step of separating the transparent crystal substrate from the light-emitting layer after a substrate bearing layer is formed on a surface of the light-emitting layer where electrodes are to be formed.

The step of forming the transfer layer may include a step of applying a silicon organic solvent to at least the part of the transparent crystal substrate or the light-emitting layer to form the transfer layer, and the step of forming the minute unevenness structure for preventing the multiple reflection may include a step of dry etching the transfer layer with a chlorine gas using the transfer layer as a resist mask to form the minute unevenness structure for preventing the multiple reflection in the transparent crystal substrate or the light-emitting layer.

The step of forming the minute unevenness structure for preventing the multiple reflection in the light-emitting layer may include a step of pressing a mold having an upper flat portion to be located near the bottoms of the minute unevenness structure for preventing the multiple reflection and a lower flat portion to be located at a position lowered from the upper flat portion by about the thickness of the upper semiconductor layer of the light-emitting layer against the transfer layer to transfer an upper flat portion and a lower flat portion together with the minute unevenness structure to the transfer layer, and forming electrode-forming portions by etching the upper and lower semiconductor layers of the light-emitting layer when dry etching is carried using the transfer layer as a resist mask.

The etching step may include a step of adjusting a selection ratio (ratio of the etching speed of the light-emitting layer to that of the resist) to from twofold to fourfold.

The step of applying the silicon organic solvent to form the transfer layer may include a step of applying the silicon organic solvent by potting or spray coating.

The pressing pressure of the mold may be preferably 5 MPa or higher and 150 MPa or lower in the case of thermoplastic material. In the case of heat-curing or photo-curing material, however, the pressing pressure of the mold may be possible to set around 0.1 MPa.

A step of forming an unevenness structure larger than the minute unevenness structure on the minute unevenness structure of the light-emitting layer may be carried out after the step of forming the minute unevenness structure for preventing the multiple reflection in the light-emitting layer.

The unevenness structure may preferably have the shape of a prism or a microlens. However, it may be possible to make the unevenness structure have the shape of a rectangular projection.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within metes and bounds of the claims, or equivalence of such metes and bounds are therefore intended to be embraced by the claims.

The invention claimed is:

1. A production method for producing a light-emitting device in which a light-emitting layer at least including an n-type semiconductor layer and a p-type semiconductor layer is layered on a transparent crystal substrate, comprising:
  applying a silicon organic solution to at least a part of the transparent crystal substrate or the light-emitting layer to form a transfer layer on at least a part of the transparent crystal substrate or the light-emitting layer wherein said transfer layer is 1 to 2 µm;
  softening or setting said transfer layer upon supplying an energy thereto;

pressing a mold formed with a minute unevenness structure against the transfer layer to transfer the minute unevenness structure to an outer surface of the transfer layer under a pressure of 5 MPa or higher and 150 MPa or lower wherein a pitch is 1 to 3 µm, wherein the mold has an upper flat portion located near a bottom of the minute unevenness structure to be transferred and a lower flat portion located at a position about a thickness of an upper semiconductor layer of the light-emitting layer, the upper flat portion and the lower flat portion are transferred together with the minute unevenness structure to the transfer layer; and forming electrode-forming portions by etching the upper and lower semiconductor layers of the light-emitting layer when dry etching is carried out using the transfer layer as a resist mask; and dry etching the transfer layer with a chlorine gas using the transfer layer as a resist mask to form a minute unevenness structure for preventing multiple reflection in the transparent crystal substrate or the light-emitting layer.

2. A production method according to claim 1, wherein forming the minute unevenness structure in the light-emitting layer includes separating the transparent crystal substrate from the light-emitting layer after a substrate bearing layer is formed on a surface of the light-emitting layer where electrodes are to be formed.

3. A production method according to claim 2, wherein the etching comprises adjusting a selection ratio of the etching speed of the light-emitting layer to that of the resist from twofold to fourfold.

4. A production method according to claim 3, wherein applying the silicon organic solvent to form the transfer layer comprises applying the silicon organic solvent by potting or spray coating.

5. A production method according to claim 4, comprising forming an unevenness structure larger than the minute unevenness structure on the minute unevenness structure of the light-emitting layer after forming the minute unevenness structure for preventing the multiple reflection in the light-emitting layer.

6. A production method according to claim 5, wherein the unevenness structure has the shape of a prism or microlens.

7. A production method according to claim 1, wherein the etching comprises adjusting a selection ratio of the etching speed of the light-emitting layer to that of the resist from twofold to fourfold.

8. A production method according to claim 1, comprising forming an unevenness structure larger than the minute unevenness structure on the minute unevenness structure of the light-emitting layer after forming the minute unevenness structure for preventing the multiple reflection in the light-emitting layer.

9. A production method according to claim 1, wherein applying the silicon organic solvent to form the transfer layer comprises applying the silicon organic solvent by potting or spray coating.

10. A production method according to claim 1, wherein the silicon organic solvent comprises:

an alcohol, an ester, a ketone or a mixture of two or more of an alcohol, an ester, and a ketone, and a silicon alkoxide component, $R_n Si(OH)_{4-n}$, where R is H or alky group, and n is an integer of 0 to 3.

11. A production method according to claim 10, wherein the silicon organic solvent contains TEOS or TMOS.

12. A production method according to claim 1, wherein the method further comprises post-baking the transfer layer at or below 120° C. after the minute unevenness structure is transferred to the transfer layer.

* * * * *

UNITED STATES PATENT AND TRADEMARK OFFICE
CERTIFICATE OF CORRECTION

| | | |
|---|---|---|
| PATENT NO. | : 7,709,282 B2 | |
| APPLICATION NO. | : 10/575489 | |
| DATED | : May 4, 2010 | |
| INVENTOR(S) | : H. Fukshima et al. | |

It is certified that error appears in the above-identified patent and that said Letters Patent is hereby corrected as shown below:

At column 16, lines 64-65 (claim 1, lines 8-9) of the printed patent, after "wherein said transfer layer", --wherein a thickness of said transfer layer-- should be inserted At column 17, line 5 (claim 1, line 16) of the printed patent, "wherein a pitch" should read --wherein a pitch of said minute unevenness structure--

Signed and Sealed this
Eighteenth Day of January, 2011

David J. Kappos
*Director of the United States Patent and Trademark Office*